United States Patent [19]
Freeman et al.

[11] Patent Number: 6,049,996
[45] Date of Patent: Apr. 18, 2000

[54] DEVICE AND FLUID SEPARATOR FOR PROCESSING SPHERICAL SHAPED DEVICES

[75] Inventors: Alex Freeman, Frisco; Ram Ramamurthi, Allen, both of Tex.

[73] Assignee: Ball Semiconductor, Inc., Allen, Tex.

[21] Appl. No.: 09/113,766

[22] Filed: Jul. 10, 1998

[51] Int. Cl.[7] ....................................... F26B 3/08
[52] U.S. Cl. .................. 34/362; 34/369; 34/588; 34/591; 134/61; 134/102.2; 134/902
[58] Field of Search ............... 34/360, 362, 369, 34/583, 588, 591, 78; 134/60, 61, 88, 102.2, 902, 102.3; 209/13, 17, 18, 132, 138, 711, 932; 257/618, 531, 532, 536

[56] References Cited

U.S. PATENT DOCUMENTS

| | | | |
|---|---|---|---|
| 2,743,814 | 5/1956 | Berg | 209/132 |
| 4,899,767 | 2/1990 | McConnell et al. | 134/56 R |
| 5,955,776 | 9/1999 | Ishikawa | 257/618 |

*Primary Examiner*—Pamela A. Wilson
*Attorney, Agent, or Firm*—Haynes & Boone, L.L.P.

[57] ABSTRACT

An apparatus and method for separating fluid from a device such as a spherical shaped semiconductor integrated circuit. To this end, one embodiment provides a first area for receiving the device, a reducing area registering with the first area, a first passage centered in the reducing area, and a second passage adjacent the first passage. The pressure inside the first area is greater than the pressure inside the reducing area. Also, the pressure inside the first passage is greater than the pressure inside the second passage. The device moves through the first area and into the reducing area. Once in the reducing area, the device is inclined to enter the first passage while at least part of the fluid is inclined to enter the second passage. As a result, the fluid is thereby separated from the device.

17 Claims, 2 Drawing Sheets

DEVICE AND FLUID SEPARATOR FOR PROCESSING SPHERICAL SHAPED DEVICES

BACKGROUND OF THE INVENTION

This disclosure relates generally to semiconductor integrated circuits, and more particularly, to an apparatus and method for separating a fluid interspersed with a spherical-shaped semiconductor device.

Conventional integrated circuits, or "chips," are formed from a flat surface semiconductor wafer. The semiconductor wafer is first manufactured in a semiconductor material manufacturing facility and is then provided to a fabrication facility. At the latter facility, several layers are processed onto the semiconductor wafer surface. Once completed, the wafer is then cut into one or more chips and assembled into packages. Although the processed chip includes several layers fabricated thereon, the chip still remains relatively flat.

Often during processing, a fluid is applied to the wafer, such as for etching or cleaning the wafer's surface. Being relatively flat, it is a simple process to tilt the wafer and thus separate the fluid from the wafer. The wafer can then be placed in a wafer carrier and moved to the next processing operation.

In co-pending U.S. patent application Ser. No. 08/858,004 filed on May 16, 1997, assigned to the same assignee as the present application and hereby incorporated by reference, a method and apparatus for manufacturing spherical-shaped semiconductor integrated circuit devices is disclosed. The spherical shaped devices are processed in various configurations, such as moving through a processing tube. However, due to the unique characteristics of this type of processing, including the continual movement of the spherical shaped devices, it is difficult to separate a fluid from the spherical shaped devices. The present invention provides an apparatus and method for separating fluid from such devices.

SUMMARY OF THE INVENTION

The present invention, accordingly, provides an apparatus and method for separating fluid from a device such as a spherical shaped semiconductor integrated circuit. To this end, one embodiment provides a first area for receiving the device, a reducing area registering with the first area, a first passage centered in the reducing area, and a second passage adjacent the first passage. The pressure inside the first area is greater than the pressure inside the reducing area. Also, the pressure inside the first passage is greater than the pressure inside the second passage.

The device moves through the first area and into the reducing area. Once in the reducing area, the device is inclined to enter the first passage while at least part of the fluid is inclined to enter the second passage. As a result, the fluid is thereby separated from the device.

DESCRIPTION OF THE PREFERRED EMBODIMENT

Figure 1:
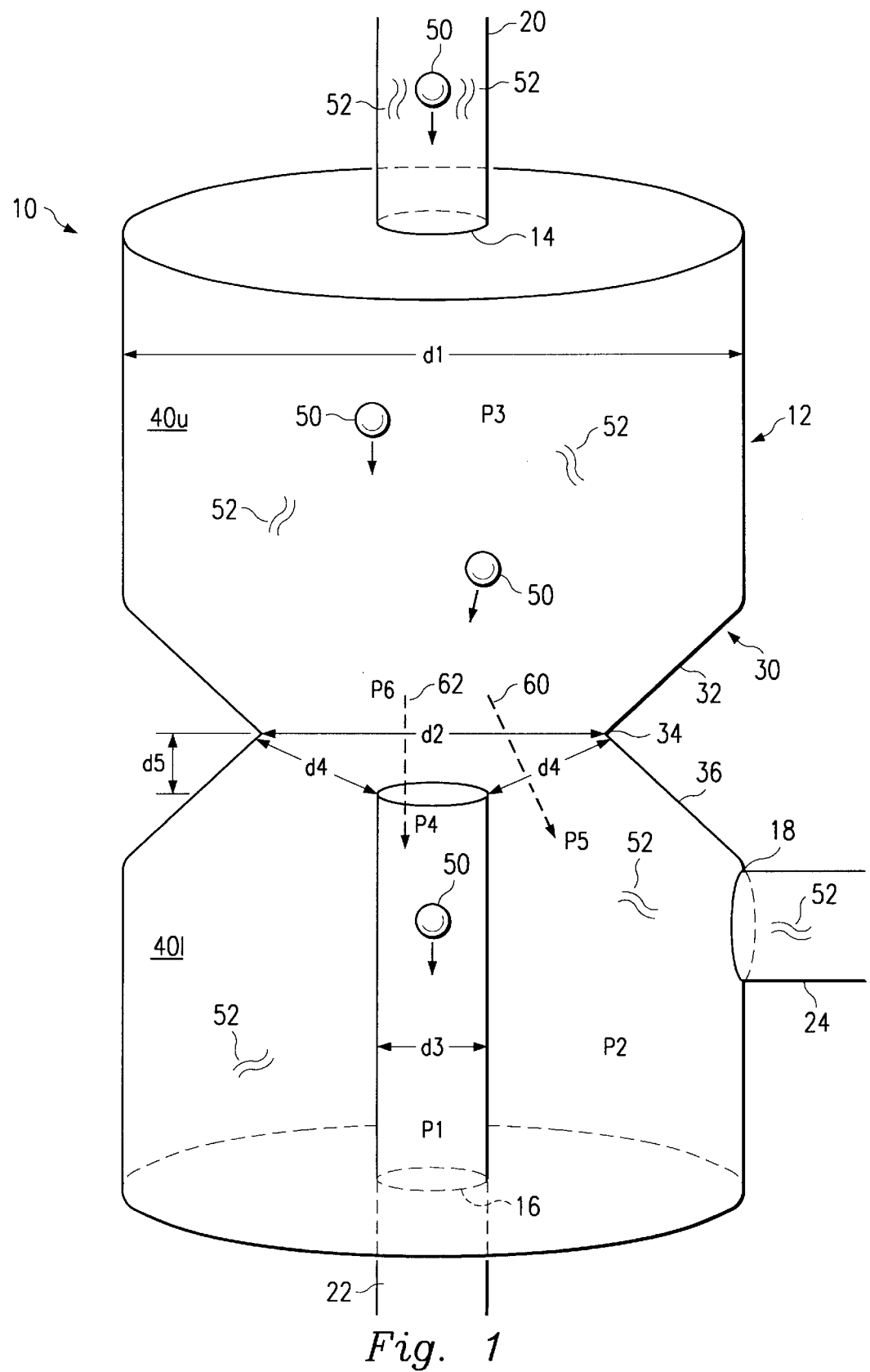
FIG. 1 illustrates a fluid separating processor according to one embodiment of the invention.

Referring to FIG. 1, the reference numeral 10 designates, in general, one embodiment of a processor for separating fluid from a spherical shaped semiconductor device. Moreover, multiple processes, such as processing a consecutive sequence of devices or consecutively aligning a series of processors 10 to repeatedly process a device, is possible by varying parameters described herein.

The processor 10 includes an enclosure 12 in the form of a hollow tube having an inlet opening 14 and two outlet openings 16, 18. The outlet opening 16 is located diametrically opposite the inlet opening 14.

One end of a vertically extending conduit 20 registers with the inlet opening 14 to allow a supply of devices to be introduced into the enclosure 12. Likewise, a conduit 22 registers with the outlet opening 16 to allow the supply of devices to exit the enclosure. One end of an exhaust conduit 24 registers with the outlet opening 18 to allow fluids to be expelled from the enclosure 12.

Formed within the enclosure 12 is a reducer 30 coaxial with the conduits 20 and 22 and the openings 14 and 16. The reducer 30 includes a narrowing portion 32, a neck 34, an a widening portion 36. The neck 34 defines two chambers within the enclosure 12. An upper chamber 40$u$ exists above the neck 34 and a lower chamber 40$l$ exists below the neck. The term upper is used to describe an area used for supplying material and the term lower is used to describe an area used for expelling the devices. It is understood that different configurations of the processor 10 may be horizontal to, or inverted from the configuration shown in FIG. 1, so that the terms upper and lower should be relatively defined.

For the sake of reference, the pressure at several locations inside the enclosure 12 are identified. A pressure P1 represents the pressure inside the conduit 22; a pressure P2 represents the pressure inside the enclosure 40$l$; a pressure P3 represents the pressure inside the enclosure 40$u$; a pressure P4 represents the pressure at the very top of the conduit 22; a pressure P5 represents the pressure between the top of the conduit 22 and the widening portion 36; and a pressure P6 represents the pressure at the neck 34. The comparative relationship of these pressures are described in detail, below.

Several distances are also defined. A distance d1 represents the interior diameter of the enclosure 40$u$ above the reducer 30; a distance d2 represents the diameter of the neck 34; a distance d3 represents the diameter of the conduit 22 (for the sake of this example, the wall thickness for the conduit 22 is negligible); and a distance d4 represents the spacing between the upper end of the conduit 22 and the neck 34. The following relationships exist between the different pressures P and distances d:

| | |
|---|---|
| P3 > P1, P2, P4, P5 and P6 | (1) |
| P1 < P2, P3, P4, P5 and P6 | (2) |
| P4 > P5 | (3) |
| P5 ≈ P2 | (4) |
| d1 > d2, d3, d4 | (5) |
| d2 > d3, d4 | (6) |
| d3 > d4. | (7) |

The distance d1 is much larger (e.g., 6 times larger) than the distance d3.

In operation, a plurality of members 50, each of a semiconductor material, are introduced into the conduit 20. The members 50 are preferably of a generally spherical shape and could be of the same type formed according to the technique disclosed in the above-identified and presently incorporated patent application Ser. No. 08/858,004. Each member 50 has a diameter that is greater than the distance d4, but less than the distance d3. A fluid 52 is included with the members 50 and in some embodiments, may help to float the members through the conduit 20. The fluid may be a flow of constituents or liquids or the like. For the sake of example, the fluid 52 is residue water from a previous cleaning process.

When the members 50 and fluid 52 enter the chamber 40u, they are moved by the relatively high pressure P3. The members and fluid are then propelled towards the reducer 30. In the preferred embodiment, the pressure P3 assists this propelling action, but in other embodiments, the momentum of the members 50 and fluid 52, or other forces, may so assist.

Once in the reducer 30, the members 50 and the fluid 52 must either move into the remaining portion of the enclosure 40l (as indicated by an arrow 60) or into the conduit 22 (as indicated by an arrow 62). Because of the lower pressure P5 (see equation 3 above), the fluid 52 is drawn in the direction 60 and away from the conduit 22. The resistance to flow in the direction 60 is much less than the resistance to flow in the direction 62 down the conduit 22. The fluid 52 may then either be collected in the lower chamber 40l or exhausted through the conduit 24.

However, the members 50 will be centered above the opening of conduit 22. Because of their greater mass, the members 50 have a greater momentum and are thus more inclined to move in the direction 62. The members 50 will enter the conduit 22 and then exit the processor 10 through the outlet opening 16.

A perpendicular distance d5 from the top of conduit 22 to the neck 34 is set to obtain the desired pressures P4 and P5. If the distance d5 is zero, then both the members 50 and the fluid 52 will pass through the conduit 22. If the distance d5 is relatively large, then neither the members 50 nor the fluid 52 will pass through the conduit 22. Between these two extremes, a desired distance d5 will allow the members 50 to pass through the conduit 22 yet only very little, if any, of the fluid 52 to pass therethrough.

Figure 2:
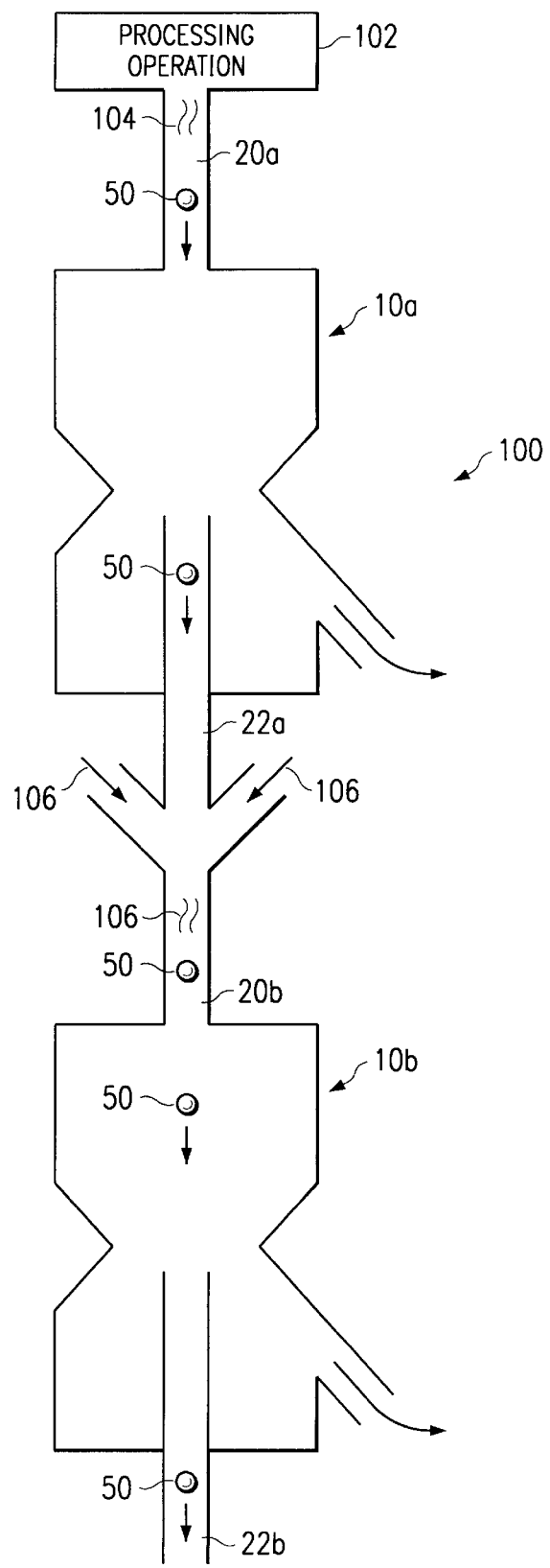
FIG. 2 illustrates an embodiment utilizing two of the processors of FIG. 1.

Referring to FIG. 2, an exemplary processing system 100 includes two processors, each being identical to the processor 10 of FIG. 1 and herein differentiated with the suffixes "a" and "b." The members 50 pass through a photo-processing operation 102 during which they are covered with etching material 104. The members 50 then pass through conduit 20a and into the processor 10a where the etching material 104 is separated from the members. The members 50 then exit through conduit 22a.

At this time, de-ionized water 106 is mixed in with the members 50. The members 50 then pass through conduit 20b and into the processor 10b where the de-ionized water 106 is separated from the members. The members then exit through the conduit 22b. As a result, a relatively quick and thorough cleaning of the members 50 will occur.

It is understood that several variations may be made in the foregoing. For example, the processors 10 may include a fluid inlet in the chamber 40u to allow de-ionized water to mix and facilitate the cleaning of the members. Also the shape of the chambers 40u and/or 40l can be changed to facilitate different requirements. Other modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. An apparatus for separating a fluid from a device, the apparatus comprising:
   an enclosure containing an input aperture and an output aperture;
   first and second chambers defined within the enclosure, the first chamber registering with the input aperture and the second chamber registering with the output aperture;
   a neck portion connected between the two chambers and having a diameter that is smaller than a diameter of either of the two chambers; and
   a conduit extending through the output aperture towards the neck portion;
   wherein the conduit provides a first passage through which the device may pass and the conduit forms a second passage with the neck and the second chamber through which the fluid may pass.

2. The apparatus of claim 1 further comprising:
   an exhaust outlet registering with the second chamber.

3. The apparatus of claim 2 wherein the exhaust outlet is adjacent the neck.

4. The apparatus of claim 1 wherein the device is substantially spherical in shape.

5. The apparatus of claim 4 wherein the first passage has a size that is larger than a diameter of the device and the second passage has a size that is smaller than the diameter of the device.

6. The apparatus of claim 1 wherein the second enclosure provides a reservoir for the separated fluid.

7. A method for separating a fluid from a spherical shaped semiconductor device, the method comprising:
   receiving the device into a first area having a first pressure associated therewith;
   directing the device to a reducing area having a second pressure associated therewith, the second pressure being less than the first pressure;
   providing a first passage centered in the reducing area and having a third pressure; and
   providing a second passage adjacent the first passage and having a fourth pressure, wherein the fourth pressure is less than the third pressure and the second pressure;
   wherein the fourth pressure can draw at least part of the fluid into the second passage.

8. The method of claim 7 wherein the second passage is concentric with the first passage.

9. The method of claim 7 wherein the first passage is provided on an opposite side of the reducing area from the first area.

10. The method of claim 7 wherein the first passage has a size that is larger than a diameter of the device and the second passage has a size that is smaller than the diameter of the device.

11. The method of claim 7 further comprising:
    providing a second area to receive the separated fluid.

12. An apparatus for separating a fluid from a spherical shaped semiconductor device, the apparatus comprising:
    a first area for receiving the device, the first area having a first pressure associated therewith;
    a reducing area registering with the first area and having a second pressure associated therewith, the second pressure being less than the first pressure;
    a first passage centered in the reducing area and having a third pressure;

a second passage adjacent the first passage and having a fourth pressure, wherein the fourth pressure is less than the third pressure and the second pressure;

wherein the device is inclined to enter the first passage while at least part of the fluid is inclined to enter the second passage.

13. The apparatus of claim 12 wherein the second passage is concentric with the first passage.

14. The apparatus of claim 12 wherein the first passage is positioned on an opposite side of the reducing area from the first area.

15. The apparatus of claim 12 wherein the first passage has a size that is larger than a diameter of the device and the second passage has a size that is smaller than the diameter of the device.

16. The apparatus of claim 12 further comprising:

a second area adjacent the second passage for receiving the separated fluid.

17. The apparatus of claim 12 wherein the reducing area comprises:

a narrowing portion registering with the first area;

a widening portion registering with the second passage; and a neck connected between the narrowing and widening portions, the neck having a diameter that is smaller than a diameter for either the narrowing portion or the widening portion.

* * * * *